United States Patent
Kamijima

(10) Patent No.: US 7,616,671 B2
(45) Date of Patent: Nov. 10, 2009

(54) LIGHT SOURCE DEVICE, CONTROL METHOD THEREFOR, LIGHTING DEVICE, MONITOR DEVICE, AND IMAGE DISPLAY DEVICE

(75) Inventor: Shunji Kamijima, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/972,261

(22) Filed: Jan. 10, 2008

(65) Prior Publication Data

US 2008/0175286 A1    Jul. 24, 2008

(30) Foreign Application Priority Data

Jan. 23, 2007  (JP) ............ 2007-012274

(51) Int. Cl.
 *H01S 3/13* (2006.01)
(52) U.S. Cl. .............. 372/30; 372/21; 372/22
(58) Field of Classification Search .......... 372/30, 372/21, 22
See application file for complete search history.

(56) References Cited

U.S. PATENT DOCUMENTS

| 2005/0276288 | A1* | 12/2005 | Kitaoka et al. ............ 372/20 |
| 2006/0023173 | A1 | 2/2006 | Mooradian et al. |
| 2006/0023757 | A1 | 2/2006 | Mooradian et al. |
| 2006/0268241 | A1 | 11/2006 | Watson et al. |
| 2006/0280219 | A1 | 12/2006 | Shchegrov |
| 2007/0153862 | A1 | 7/2007 | Shchegrov et al. |
| 2007/0153866 | A1 | 7/2007 | Shchegrov et al. |
| 2008/0175283 | A1* | 7/2008 | Ookubo et al. ............ 372/21 |

FOREIGN PATENT DOCUMENTS

JP    9-232665    9/1997

OTHER PUBLICATIONS

Mooradian et al., "High Power Extended Vertical Cavity Surface Emitting Diode Lasers and Arrays and their Applications," Micro-Optics Conference, Tokyo, Japan, Nov. 2, 2005.

* cited by examiner

*Primary Examiner*—Dung T Nguyen
(74) *Attorney, Agent, or Firm*—Oliff & Berridge, PLC

(57) ABSTRACT

A light source device includes a light source for emitting a laser beam, a power supply drive circuit for pulse-driving the laser beam, a wavelength conversion element for converting a wavelength of a laser beam into a predetermined wavelength, a photodetector for detecting an intensity of the laser beam emitted from the wavelength conversion element, and a control section that controls a drive condition of the laser beam emitted from the wavelength conversion element based on the intensity detected by the photodetector, wherein the control section includes an optimization setting section that, in response to the intensity of the photodetector in a present pulse drive condition being outside a predetermined range, controls a drive condition of the laser beam to extract an optimum pulse drive condition, and sets the extracted optimum pulse drive condition to the drive condition of the laser beam instead of the present pulse drive condition, and the optimization setting section, in extracting the optimum drive condition, restores the present pulse drive condition in a predetermined period of time after replacing the present pulse drive condition with a predetermined pulse drive condition for extracting the optimum pulse drive condition.

19 Claims, 11 Drawing Sheets

LIGHT SOURCE DEVICE, CONTROL METHOD THEREFOR, LIGHTING DEVICE, MONITOR DEVICE, AND IMAGE DISPLAY DEVICE

This application claims priority from Japanese Patent Application No. 2007-012274 filed in the Japanese Patent Office on Jan. 23, 2007, the entire disclosure of which is hereby incorporated by reference in its entirety.

BACKGROUND

1. Technical Field

The present invention relates to a light source device, a control method therefor, a lighting device, a monitor device, and an image display device.

2. Related Art

In the past, a UHP lamp has been used as a lighting beam source for a projector, but has problems regarding restriction in the color reproducibility range, instant lighting, a life, and so on. Therefore, use of a semiconductor laser as the lighting beam source for a projector has been proposed. However, since sufficient intensity of light in the visible wavelength range cannot be obtained directly from a semiconductor laser source, a second harmonic generator (SHG) for converting an infrared wavelength into a half wavelength thereof is used concomitantly with the semiconductor laser source. Further, in order for obtaining a stable light output, feedback control of a drive current of a semiconductor laser has also been performed (see e.g., JP-A-9-232665).

However, in the past configuration, there is no designation regarding timing of laser current control or temperature control of the light source device, and in the case in which a calibration of the light intensity is performed while operating as a light source, there is caused a problem that in the calibration process, the intensity of emitted light temporarily decreases or increases for a time period recognizable to the observer depending on whether or not the drive condition is appropriate, thus an intensity variation in the lighting beam is observed.

Further, the light source device is mainly composed of a resonator to which a specific wavelength is set as a resonant wavelength and a wavelength conversion element for converting the wavelength set to the resonator. However, it is known that the oscillation wavelength of the light source device shifts in accordance with the temperature, and it is a challenge to obtain a high power output with a stable oscillation wavelength.

On the other hand, it is known that the wavelength conversion element, which has a function of converting the wavelength of the input infrared laser into, for example, a half wavelength, causes energy absorption of about $1E^{-2}$ through $1E^{-4}$ of the infrared light, resulting in generation of temperature variation dependent on the input infrared light beam.

$$P = \in_{0\chi}^{(1)} E + \in_{0\chi}^{(2)} EE + \in_{0\chi}^{(3)} EEE + \ldots = P^{(1)} + P^{(2)} + P^{(3)} + \ldots$$

(P: second-harmonic power, $\in_0$: electric constant in vacuum, $\chi^{(1)}, \chi^{(2)}, \chi^{(3)} \ldots$: nonlinear susceptibility, E: energy density per limit area).

The formula described above represents the energy relationship in executing the wavelength conversion on the incident light beam, and since the high order energy such as second-order or third-order is added, it can be confirmed that high-power energy injection contributes to achievement of high efficiency. When viewed from the opposite side, if low energy is injected, loss of energy as heat absorption becomes large, thus the heating energy of the wavelength conversion element should be increased.

On the other hand, the temperature range in which a PPLN, the wavelength conversion element, operates at high efficiency is typically within one degree, which requires high-accuracy temperature control, and the shrinkage and expansion of the wavelength conversion element caused by the temperature variation according to the variation in the condition of the infrared laser beam makes the efficiency variation thereof large.

As described above, in realizing the light source capable of operating at high efficiency, it is necessary to optimize the drive condition of the laser emission source so that the wavelength shift and reduction of emission efficiency dependent on the temperature in the laser source can be suppressed, and the wavelength conversion efficiency in the wavelength conversion element can be maintained. As shown in FIG. 11, the relationship between elapsed time and a drive condition (e.g., a pulse width) in a past pulse drive condition setting changes continuously from the present condition, and is switched to an optimum power B by automatic power control from a time point A when the optimum point is detected. Since the relationship changes continuously, the light intensity variation is confirmed by the observer to make the observer feel the light intensity variation of a picture, thus a preferable picture can hardly be obtained.

SUMMARY

Exemplary embodiments include a light source device, a control method for the light source device, a lighting device, a monitor device, and an image display device with which a high-efficiency and high-power light beam, and therefore, a bright picture can be obtained.

Exemplary embodiments a light source device including a light source for emitting a laser beam, a power supply drive circuit for pulse-driving the laser beam, a wavelength conversion element for converting a wavelength of a laser beam into a predetermined wavelength, a photodetector for detecting an intensity of the laser beam emitted from the wavelength conversion element, and a control section that controls a drive condition of the laser beam emitted from the wavelength conversion element based on the intensity detected by the photodetector, wherein the control section includes an optimization setting section that, in response to the intensity of the photodetector in a present pulse drive condition being outside a predetermined range, controls a drive condition of the laser beam to extract an optimum pulse drive condition, and sets the extracted optimum pulse drive condition to the drive condition of the laser beam instead of the present pulse drive condition, and the optimization setting section, in extracting the optimum drive condition, restores the present pulse drive condition in a predetermined period of time after replacing the present pulse drive condition with a predetermined pulse drive condition for extracting the optimum pulse drive condition.

According to embodiments, by restoring the intensity of the laser beam detected by the photodetector in extracting the optimum pulse drive condition to the intensity in a predetermined range based on the intensity in the present pulse drive condition in a predetermined period of time, the optimum pulse drive condition can be obtained without the variation in the intensity caused by the change in the pulse drive condition in adjusting the laser drive condition or after the change in the laser drive condition being sensed by the observer. By achieving the optimization of the pulse drive condition of the light source, the optimization of the temperature of the wavelength conversion element can be achieved to provide a light source device capable of obtaining a high-efficiency and high-power light beam, and further a bright picture.

In the light source device according to embodiments, it is also possible that the optimization setting section changes the drive condition of the laser beam in a discontinuous manner.

In the light source device according to embodiments, it is also possible that the optimization setting section changes the drive condition of the laser beam from the present pulse drive condition to the optimum pulse drive condition via at least one pulse drive condition different from both the present pulse drive condition and the optimum pulse drive condition.

In the light source device according to embodiments, it is also possible that the optimization setting section, in changing the drive condition of the laser beam to the optimum pulse drive condition, changes the drive condition of the laser beam so that a change in the intensity from the present pulse drive condition to the optimum pulse drive condition has a predetermined gradient.

Embodiments include a control method of a light source device including the steps of (a) emitting a laser beam, (b) pulse-driving the laser beam, (c) converting a wavelength of a laser beam into a predetermined wavelength, (d) detecting an intensity of the laser beam emitted in step (c), and (e) controlling drive condition of the laser beam emitted in step (c) based on the intensity detected in step (d), wherein step (e) includes (f) controlling, in response to the intensity detected in step (d) in a present pulse drive condition being outside a predetermined range, a drive condition of the laser beam to extract an optimum pulse drive condition, and sets the extracted optimum pulse drive condition to the drive condition of the laser beam instead of the present pulse drive condition, and step (f) includes (g) restoring, in extracting the optimum drive condition, the present pulse drive condition in a predetermined period of time after replacing the present pulse drive condition with a predetermined pulse drive condition for extracting the optimum pulse drive condition.

According to embodiments, by restoring the intensity of the laser beam detected by the photodetector in extracting the optimum pulse drive condition to the intensity in a predetermined range based on the intensity in the present pulse drive condition in a predetermined period of time, the optimum pulse drive condition can be obtained without the variation in the intensity caused by the change in the pulse drive condition in adjusting the laser drive condition or after the change in the laser drive condition being sensed by the observer. By achieving the optimization of the pulse drive condition of the light source, the optimization of the temperature of the wavelength conversion element can be achieved to provide a control method of a light source device capable of obtaining a high-efficiency and high-power light beam, and further a bright picture.

In the control method of a light source device according embodiments, it is also possible that in step (f), the drive condition of the laser beam is changed in a discontinuous manner.

In the control method of a light source device according to embodiments it is also possible that in step (f), the drive condition of the laser beam is changed from the present pulse drive condition to the optimum pulse drive condition via at least one pulse drive condition different from both the present pulse drive condition and the optimum pulse drive condition.

In the control method of a light source device according to embodiments, it is also possible that in step (f), in changing the drive condition of the laser beam to the optimum pulse drive condition, the drive condition of the laser beam is changed so that a change in the intensity from the present pulse drive condition to the optimum pulse drive condition has a predetermined gradient.

Embodiments include a lighting device including the light source device described above.

According to embodiments, by restoring the intensity of the laser beam detected by the photodetector in extracting the optimum pulse drive condition to the intensity in a predetermined range based on the intensity in the present pulse drive condition in a predetermined period of time, the optimum pulse drive condition can be obtained without the variation in the intensity caused by the change in the pulse drive condition in adjusting the laser drive condition or after the change in the laser drive condition being sensed by the observer. By achieving the optimization of the pulse drive condition of the light source, the optimization of the temperature of the wavelength conversion element can be achieved to provide a lighting device capable of obtaining a high-efficiency and high-power light beam, and further a bright picture.

According to embodiments there is provided a monitor device including the lighting device described above, and an imaging section for imaging a subject lighted by the lighting device.

According to embodiments, by restoring the intensity of the laser beam detected by the photodetector in extracting the optimum pulse drive condition to the intensity in a predetermined range based on the intensity in the present pulse drive condition in a predetermined period of time, the optimum pulse drive condition can be obtained without the variation in the intensity caused by the change in the pulse drive condition in adjusting the laser drive condition or after the change in the laser drive condition being sensed by the observer. By achieving the optimization of the pulse drive condition of the light source, the optimization of the temperature of the wavelength conversion element can be achieved to provide a monitor device capable of obtaining a high-efficiency and high-power light beam, and further a bright picture.

According to embodiments, there is provided an image display device including the lighting device described above, and displaying an image using the light from the lighting device described above.

According to embodiments, by restoring the intensity of the laser beam detected by the photodetector in extracting the optimum pulse drive condition to the intensity in a predetermined range based on the intensity in the present pulse drive condition in a predetermined period of time, the optimum pulse drive condition can be obtained without the variation in the intensity caused by the change in the pulse drive condition in adjusting the laser drive condition or after the change in the laser drive condition being sensed by the observer, and further, the observed picture can be provided with natural brightness based on the picture signal, thus a stress-free picture can be obtained. By achieving the optimization of the pulse drive condition of the light source, the optimization of the temperature of the wavelength conversion element can be achieved to provide an image display device capable of obtaining a high-efficiency and high-power light beam, and further a bright picture.

BRIEF DESCRIPTION OF THE DRAWINGS

Embodiments will now be described with reference to the accompanying drawings, wherein like numbers refer to like elements.

DESCRIPTION OF EXEMPLARY EMBODIMENTS

Embodiments of the invention will hereinafter be described with reference to the accompanying drawings.

First Embodiment

Configuration of Lighting Device

Figure 1:
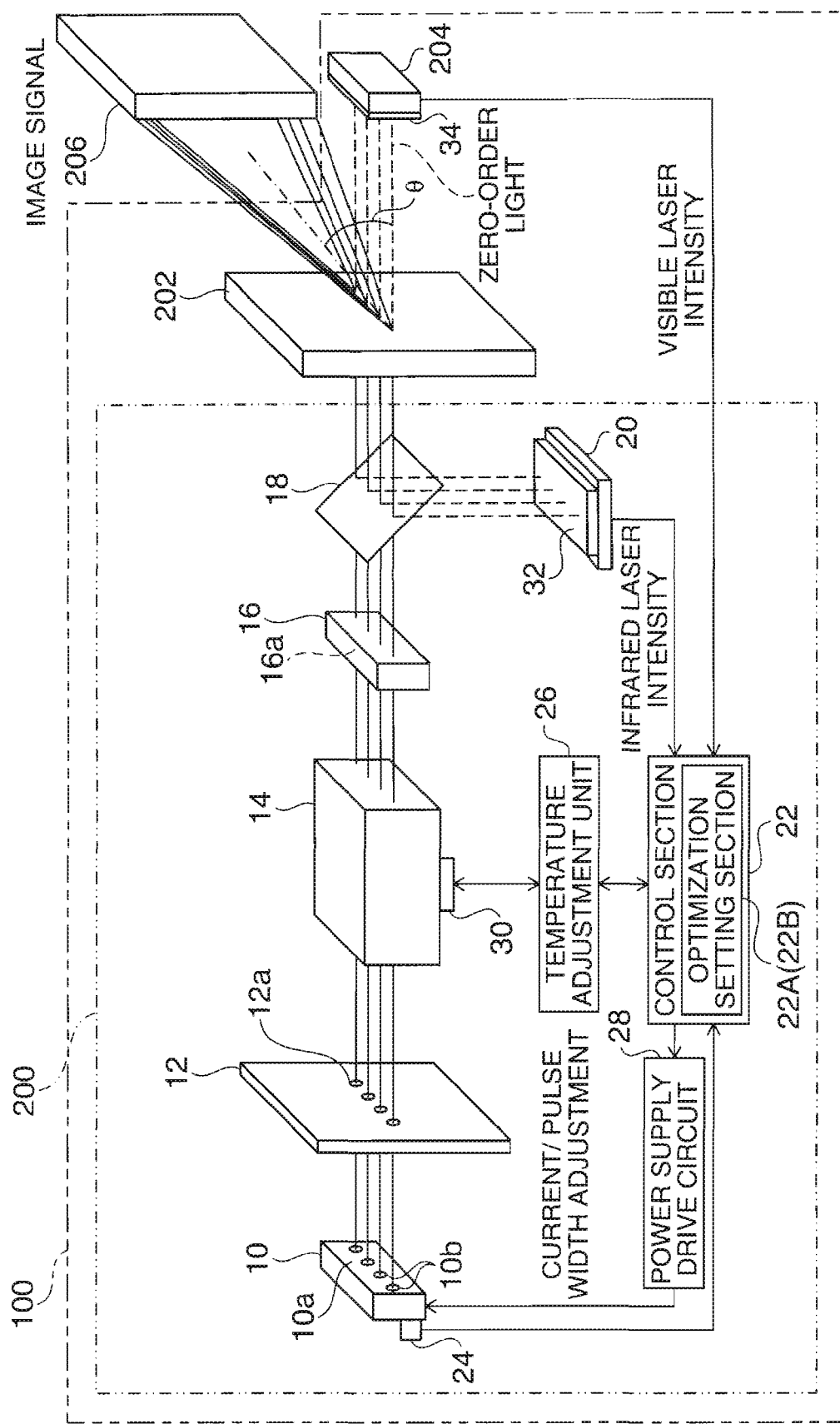
FIG. 1 is a block diagram showing a configuration of a lighting device according to a first embodiment of the invention.

FIG. 1 is a block diagram showing a configuration of a lighting device according to a first embodiment of the invention. As shown in FIG. 1, a lighting device 100 according to the present embodiment includes a light source device 200, a hologram element 202 for diffusing the light emitted from the light source device 200, a visible light sensor 204 as a photodetector for detecting the intensity of zero-order light emitted from the hologram element 202. It is assumed in the present embodiment that the light diffused by the hologram element 202 is emitted onto a liquid crystal light valve 206 for modulating the light in accordance with an image signal input therein. The liquid crystal light valve 206 is used for a projector for enlargedly projecting an image. It should be noted that the target to be illuminated by the lighting device 100 is not limited to the liquid crystal light valve 206.

The light source device 200 includes a semiconductor laser array 10 as a light source, a light shield plate 12, a wavelength conversion element 14, a reflecting mirror 16, an infrared beam splitter 18, an infrared beam sensor 20 as a photodetector, a control section 22, and a power supply drive circuit 28. The semiconductor laser array 10 emits laser beams (infrared laser beams). The semiconductor laser array 10 is a type called a vertical-cavity surface-emitting laser (VCSEL) which emits an infrared laser beam perpendicularly to a substrate surface 10a, and has a one-dimensional array structure in which a plurality of luminescent layer (active layer) sections 10b are arranged in a line. Although the number of the luminescent layer sections 10b is four in the illustrated example, the number does not need to be limited to four.

Although in the present embodiment, as described above, the VCSEL type is used as the semiconductor laser array 10, a configuration using an edge-emitting laser array instead, which has a resonant direction of the light parallel to the substrate surface, can also be adopted. Further, as the laser source, other kinds of lasers such as a solid-state laser, a liquid laser, a gas laser, or a free electron laser can also be used instead of the semiconductor laser. A thermistor 24 as a temperature sensor is attached to the semiconductor laser array 10. The thermistor 24 is connected to the control section 22. The control section 22 controls the amount and the pulse width of the electric current applied to the semiconductor laser array 10 via the power supply drive circuit 28 so that the measured temperature of the thermistor 24 becomes a temperature (e.g., 90° C.) at which the emission efficiency of the infrared laser beam of the semiconductor laser array 10 becomes the maximum, thereby controlling the output of the infrared laser beam emitted from the semiconductor laser array 10. The power supply drive circuit 28 drives the semiconductor laser array 10 to emit a pulsed infrared laser beam.

The light shield plate 12 is disposed between the semiconductor laser array 10 and the wavelength conversion element 14, and is provided with through holes 12a at positions respectively corresponding to the luminescent layer sections 10b of the semiconductor laser array 10. The periphery of the light shield plate 12 has contact with a housing of the light source device 200. In other words, the inside of the light source device 200 is divided into two spaces by the light shield plate 12; one is a space in which the laser array 10 exists, and the other is a space in which the other members exist. The light beams emitted from the semiconductor laser array 10 in a direction perpendicular thereto are introduced to the wavelength conversion element 14 by passing through the respective through holes 12a of the light shield plate 12, and if, for some reason, the infrared laser beam is emitted in a direction other than the perpendicular direction, the laser beam (hereinafter referred to as an undesired laser beam) should be blocked by the light shield plate 12. In other words, the light shield 12 makes it possible to prevent the undesired laser beam from reaching a temperature adjuster 30 directly or indirectly. As a result, the temperature adjuster 30 can be prevented from mismeasuring the temperature of the wavelength conversion element 14, thus it becomes possible to control the temperature of the wavelength conversion element 14 with good accuracy.

The wavelength conversion element 14 converts the wavelength of the infrared laser beam into a predetermined wavelength. The wavelength conversion element 14 is an element for causing a phenomenon of second harmonic generation (SHG), namely an element for causing a second-order nonlinear optical phenomenon of converting two photons into one photon with a frequency double as high as that of the original photons. This element is obtained by providing a polarization inversion structure to a ferroelectric member. The wavelength conversion element 14 introduces the infrared laser beam emitted from the semiconductor laser array 10 to the inside thereof and converts the wavelength thereof to generate a visible laser beam with a color such as blue or green. The polarization inversion structure inside the wavelength conversion element 14 is formed by an electric field application method in an element using lithium niobate or lithium tantalate. It should be noted that the method of forming the polarization inversion structure is not necessarily limited to this method, but other methods such as a polarization inversion method by ion exchange or a micro-domain inversion method with an electron beam can also be used therefor. Regarding the material, it is not necessarily limited to lithium niobate and lithium tantalate, a configuration using an appropriate material for each of the methods can be adopted.

To the wavelength conversion element 14, there is attached the temperature adjuster 30 including a temperature sensor, a heater for raising the temperature of the wavelength conversion element 14, and a peltiert element for cooling the wavelength conversion element 14. The temperature adjuster 30 is connected to a temperature adjustment unit 26. The temperature adjustment unit 26 is connected to the control section 22. The temperature adjustment unit 26 measures the temperature of the wavelength conversion element 14 by the temperature adjuster 30, and adjusts the temperature of the wavelength conversion element 14 by controlling the temperature adjuster 30. The control section 22 controls the temperature adjustment unit 26 so that the measured temperature of the temperature adjustment unit 26 becomes the temperature (e.g., 90° C.) at which the wavelength conversion efficiency of the wavelength conversion element 14 becomes the maximum, thereby adjusting the temperature of the wavelength conversion element 14. It should be noted that the control section 22 can also control the output of the infrared laser beam emitted from the semiconductor laser array 10 by making the amount and the pulse width of the electric current applied to the semiconductor laser array 10 be adjusted.

The reflecting mirror 16 has a surface 16a provided with a coating on the side of the wavelength conversion element 14. The coating is highly reflective to the excitation light emitted from the semiconductor laser array 10, and is highly transmissive to the second harmonic wave emitted from the wavelength conversion element 14. On the other hand, a substrate surface 10a on the emission side of the semiconductor laser array 10 is provided with a coating which is highly transmissive to the excitation light, and is highly reflective to the second harmonic wave described above. According to this configuration, an optical resonator is configured between the substrate surface 10a of the semiconductor laser array 10 and the surface 16a of the reflecting mirror 16. The infrared laser beam emitted from the semiconductor laser array 10 is arranged to be confined in the optical resonator, thus transmitted through the wavelength conversion element 14 a number of times. Since the wavelength conversion element 14 is controlled in the temperature by the control section 22 as described above, the second harmonic wave with little noises can be obtained. The second harmonic wave is transmitted through the reflecting mirror 16, and is emitted onto the hologram element 202 as a laser beam converted into a visible light.

The infrared beam splitter 18 is for reflecting the infrared laser beam included in the light beam transmitted through the reflecting mirror 16, and transmitting the visible laser beam included therein. The reflected infrared laser beam is emitted onto the infrared beam sensor 20.

The infrared beam sensor 20 detects the intensity of the infrared laser beam emitted from the wavelength conversion element 14. The infrared beam sensor 20 is composed of a photo diode, and is provided with an infrared band-pass filter 32 transmitting only the infrared beam attached to the surface thereof.

The hologram element 202 receives the visible laser beam transmitted through the infrared beam splitter 18, and diffusely emits the visible laser beam to the liquid crystal light valve 206. The liquid crystal light valve 206 is disposed at a position shifted in parallel to the hologram element 202 to form a predetermined angle θ so as not to receive the zero-order light of an undiffracted component transmitted through the hologram element 202. By thus disposing the liquid crystal light valve 206, since the zero-order light transmitted through the hologram element 202 can be prevented from entering the liquid crystal light valve 206, even lighting can be performed. In order for diffusely emitting the visible laser beam to the liquid crystal light valve 206 disposed so as to be shifted to form the angle θ, the hologram element 202 is previously provided with an interference pattern formed by a method of a computer-generated hologram (CGH) so that the light beam is diffused with this angle. As described above, by using the method of CGH, the visible laser beam can be diffused in any desired directions and ranges.

The visible light sensor 204 detects the intensity of the visible laser beam emitted from the wavelength conversion element 14. The visible light sensor 204 is disposed at a position where the zero-order light transmitted through the hologram element 202 enters. Since the zero-order light is inevitably generated by using the hologram element 202, there is no need for making the light beam separately diverge to enter the visible light sensor 204 when disposing the visible light sensor 204 at such a position. Therefore, the intensity of the visible laser beam can efficiently be measured without decreasing the lighting intensity. The visible light sensor 204 is composed of a photo diode, and is provided with a visible band-pass filter 34 transmitting only the visible light attached to the surface thereof.

The control section 22 controls a drive condition of the infrared laser beam emitted from the wavelength conversion element 14 based on the intensity of the light detected by the infrared beam sensor 20. The control section 22 controls a drive condition of the visible laser beam emitted from the wavelength conversion element 14 based on the intensity of the light detected by the visible light sensor 204. The control section 22 includes an optimization setting section 22A for extracting and setting the optimum pulse drive condition by controlling the drive condition of the infrared laser beam in the case in which the light intensity of the infrared beam sensor 20 and/or the visible light sensor 204 in the present drive condition is outside a predetermined range. In extracting the optimum pulse drive condition, the pulse drive condition is changed from the present pulse drive condition to a predetermined pulse drive condition in order for extracting the optimum pulse drive condition, and then in a predetermined period of time, the present pulse drive condition is restored. The optimization setting section 22A changes the drive condition of a drive pulse of the infrared laser beam in a discontinuous manner. When changing to the optimum pulse drive condition, the optimization setting section 22A changes the pulse drive condition from the present pulse drive condition to the optimum pulse drive condition via at least one pulse drive condition different from both of the present pulse drive condition and the optimum pulse drive condition. The optimization setting section 22A changes the present pulse drive condition to the optimum pulse drive condition so that the change in the light intensity from the present pulse drive condition to the optimum pulse drive condition has a predetermined gradient. The control section 22 is configured as a microcomputer housing a CPU, RAM, and ROM inside.

Although in the present embodiment using the reflecting mirror on the outside of the semiconductor laser array, the light source device is a so-called external oscillator type, a configuration using an internal oscillation laser source instead thereof can also be adopted.

Optimization Setting Section

Figure 2:
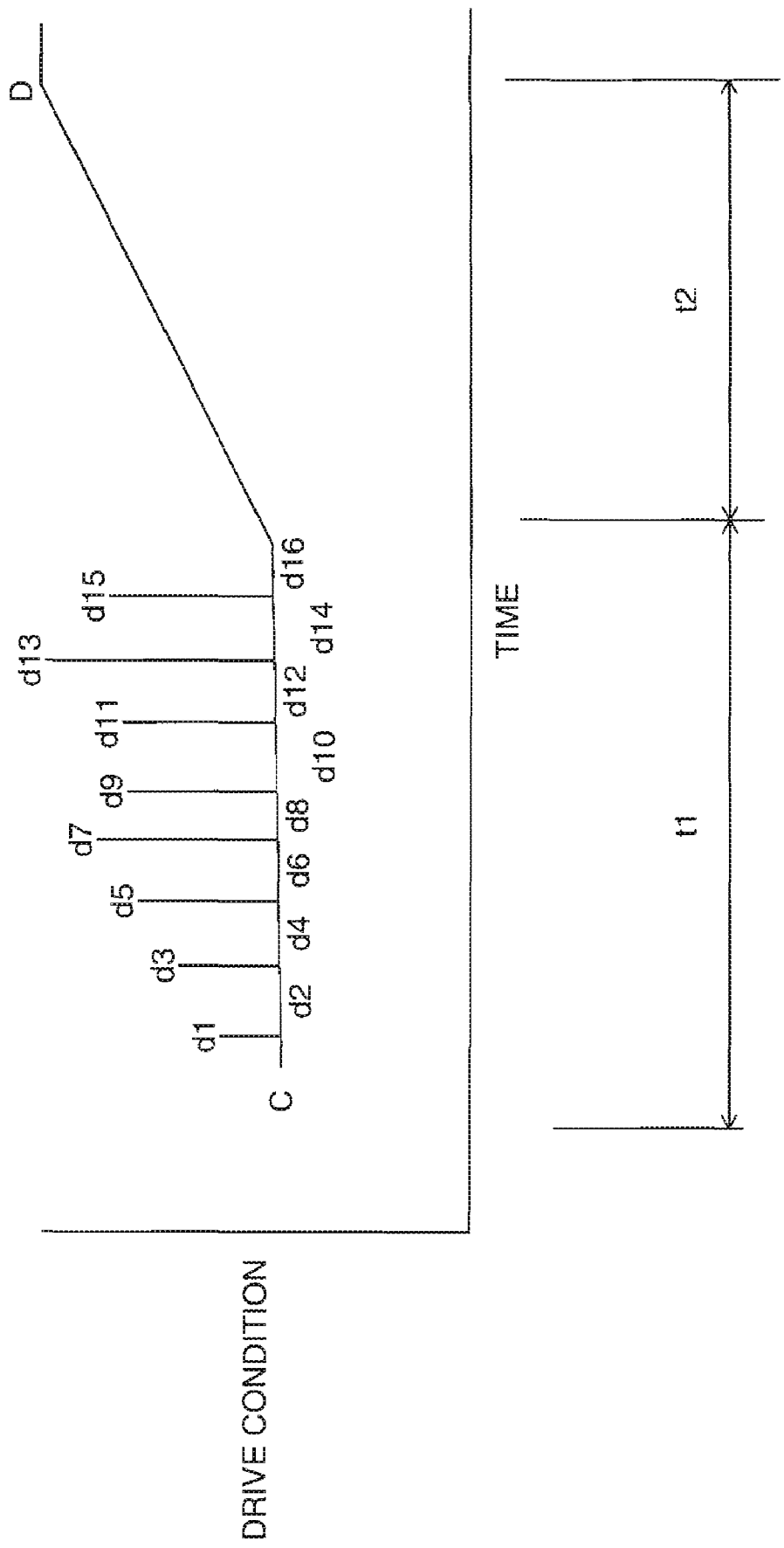
FIG. 2 is a diagram showing an optimization setting section according to the first embodiment of the invention.

FIG. 2 is a diagram showing the optimization setting section according to the first embodiment of the invention. The optimization setting section 22A according to the present embodiment changes the drive condition of the drive pulse of the power supply drive circuit 28 to the semiconductor laser array 10 in a discontinuous manner. Here, the condition of the drive pulse denotes an amount of electric current, a pulse width, and so on. The optimization setting section 22A changes a extraction drive pulse for extracting the optimum pulse drive condition in a discontinuous manner. When changing the condition of the drive pulse from the present pulse drive condition to the optimum pulse drive condition, the optimization setting section 22A changes the pulse drive condition from the present pulse drive condition to the optimum pulse drive condition via at least one pulse drive condition different from both of the present pulse drive condition and the optimum pulse drive condition. The optimization setting section 22A changes the present pulse drive condition to the optimum pulse drive condition so that the change from the present pulse drive condition to the optimum pulse drive condition has a predetermined gradient.

Specifically, as shown in FIG. 2, in extracting the optimum drive condition D for outputting a predetermined light intensity, while driving with the present pulse condition C, driving with each of extraction pulse conditions d1, d3, d5, d7, d9, d11, d13, and d15 is performed (t1). Since the extraction time for outputting the extraction drive pulse with each of the extraction pulse conditions d1, d3, d5, d7, d9, d11, d13, and d15 is 1/60 second, the light intensity variation during the moment is hardly sensed by the observer. After then, when moving to (t2) the optimum pulse drive condition for outputting light with a predetermined intensity, a predetermined period of time is spent, different pulse drive condition is set prior to moving to the optimum pulse drive condition, thus switching of the pulse drive condition is performed so as not to be sensed by the observer. It is known that with the sensitivity of the human to a luminance variation, an instant variation shorter than about 1/60 second is not sensed, further, it is also known in general that the human is insensitive of a luminance variation of less than 2% for 20 through 30 milliseconds.

Optimization Setting Process

Figure 3:
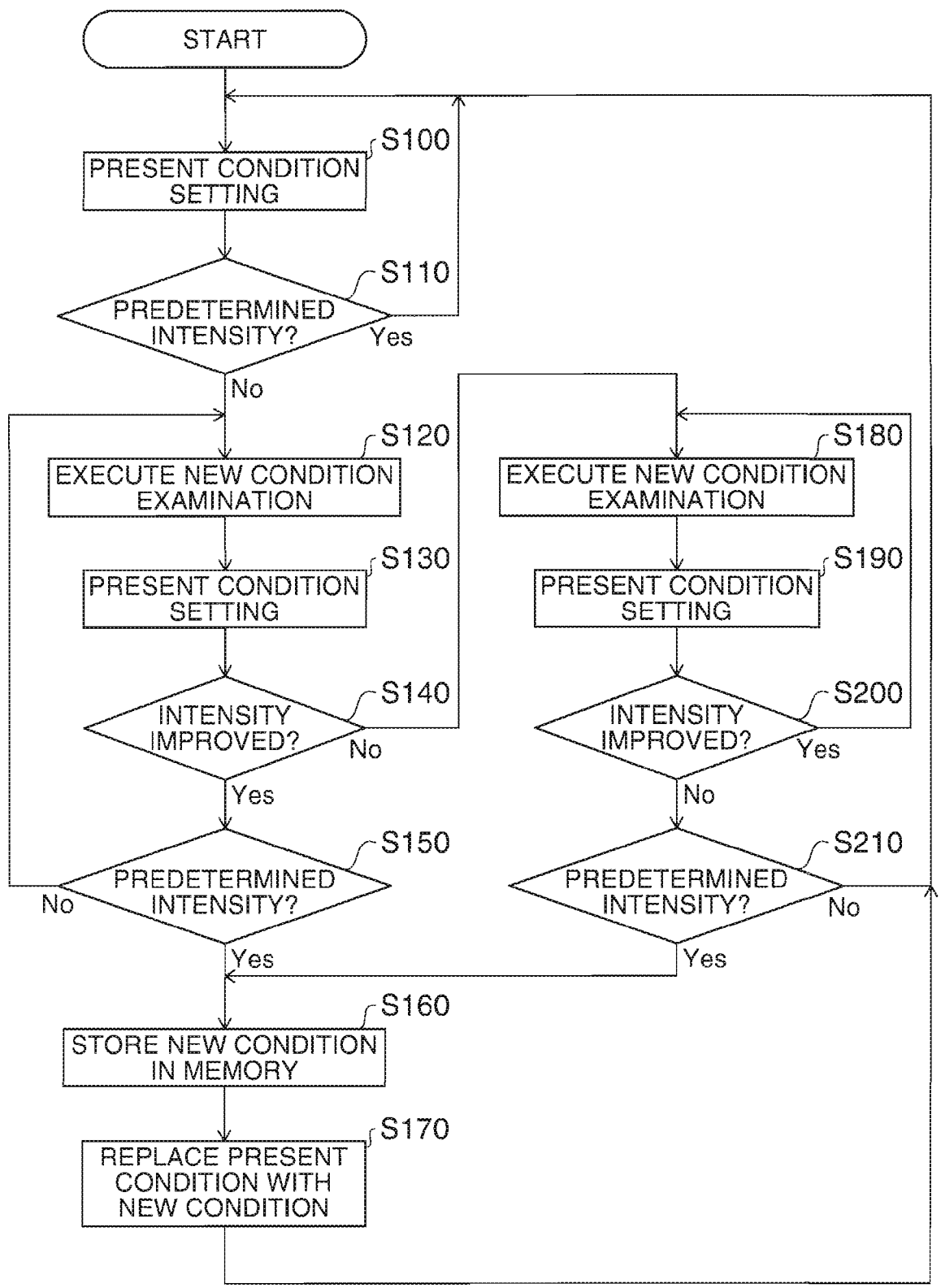
FIG. 3 is a flowchart of an optimization setting process according to the first embodiment of the invention.
Figure 4A:
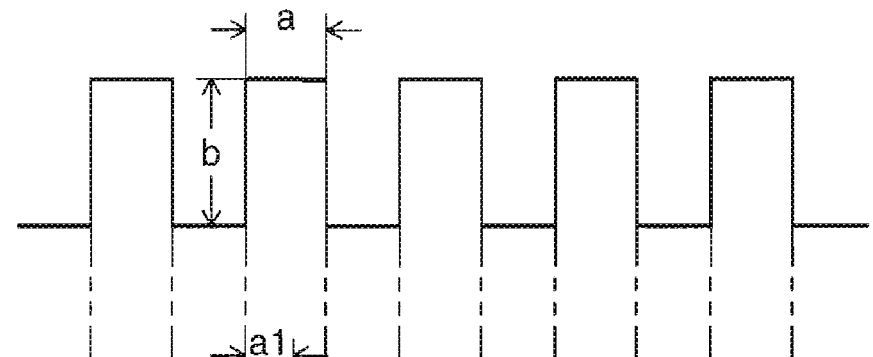
FIG. 4 is a diagram of a pulse drive condition of a laser source according to the first embodiment of the invention.
Figure 4B:
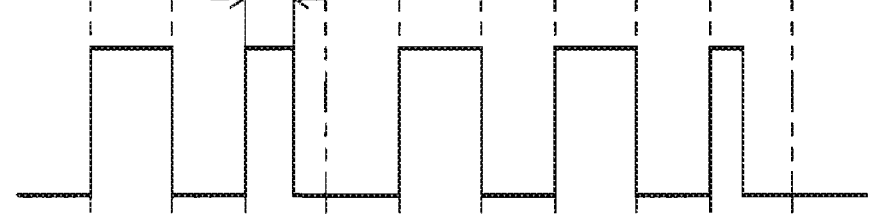
Figure 4C:
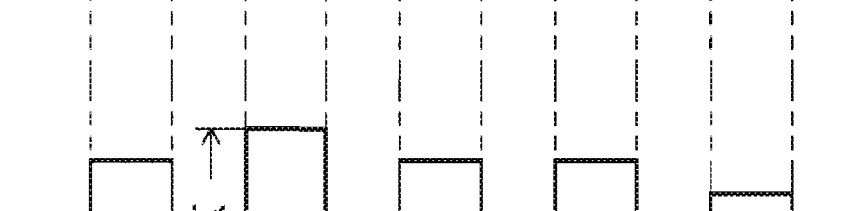
Figure 4D:
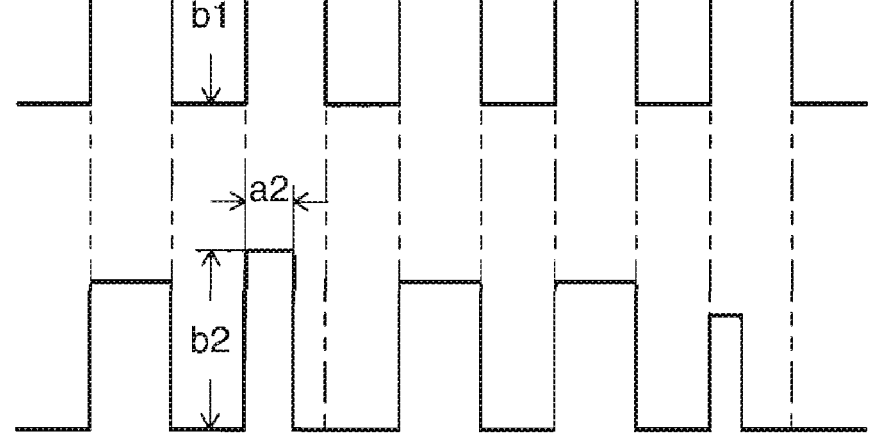

FIG. 3 is a flowchart of an optimization setting process according to the first embodiment of the invention. A control process of this processing is performed in the control section 22 immediately after starting-up the lighting device 100. The control process includes the optimization setting process for extracting and setting the optimum pulse drive condition by controlling the drive condition of the infrared laser beam in the case in which the light intensity of the infrared beam sensor 20 and/or the visible light sensor 204 in the present drive condition is outside a predetermined range. In extracting the optimum pulse drive condition, the pulse drive condition is restored from the new condition to be examined to the present pulse drive condition in a predetermined period of time. In the optimization setting process, the drive condition of a drive pulse of the infrared laser beam is changed in a discontinuous manner. In the optimization setting process, in changing the condition of the drive pulse from the present pulse drive condition to the optimum pulse drive condition, the pulse drive condition is changed from the present pulse drive condition to the optimum pulse drive condition via at least one pulse drive condition different from both of the present pulse drive condition and the optimum pulse drive condition. In the optimization setting process, the present pulse drive condition is changed to the optimum pulse drive condition so that the change in the light intensity from the present pulse drive condition to the optimum pulse drive condition has a predetermined gradient.

Specifically, as shown in FIG. 3, firstly, the control section 22 sets the present pulse drive condition to the amount of the current and pulse width to be applied to the semiconductor laser array 10. The control section 22 measures the intensity VL of the visible laser beam using the visible light sensor 204, and further measures the intensity IR of the infrared laser beam using the infrared beam sensor 20 (step S100).

Subsequently, based on these measured values, whether or not the intensities VL, IR are in predetermined ranges is judged (step S110). These predetermined intensities are values previously stored in the RAM based on the emission characteristic of the infrared laser beam of the semiconductor laser array 10 and the wavelength conversion efficiency characteristic of the wavelength conversion element 14.

As a result of the above judgment, if it is judged that the intensities VL, IR do not reach the predetermined intensities (No in step S110), the control section 22 sets a new pulse drive condition to the amount of current and the pulse width to be applied to the semiconductor laser array 10, and executes an examination of the output of the infrared laser beam emitted from the semiconductor laser array 10. In the examination, the control section 22 measures the intensity VLtest of the visible laser beam using the visible light sensor 204, and further measures the intensity IRtest of the infrared laser beam using the infrared beam sensor 20 (step S120). The new pulse drive condition is a value previously stored in the RAM based on the emission characteristic of the infrared laser beam of the semiconductor laser array 10 and the wavelength conversion efficiency characteristic of the wavelength conversion element 14.

Subsequently, the control section 22 performs setting for restoring the amount of current and the pulse width to be applied to the semiconductor laser array 10 to the present pulse drive condition (step S130).

Subsequently, based on the measured values of the intensities VLtest, IRtest measured in the step S120, whether or not the intensities have been improved in comparison with the previous measured values is judged (step S140). These previous measured values are the intensities VL, IR in the present condition setting at the first time, and on or later the second time, they become the intensities VLtest, IRtest in the previous new pulse drive condition.

As a result of the above judgment, if it is judged that the intensities VLtest, IRtest have been improved (Yes in step S140), the control section 22 judges whether or not the intensities VLtest, IRtest are in the predetermined ranges (step S150).

As a result of the above judgment, if it is judged that the intensities VLtest, IRtest have reached the predetermined ranges (Yes in step S150), the amount of current and the pulse width applied to the semiconductor laser array 10 at that moment are stored in the RAM (step S160). According to this step, the optimization of the drive condition of the semiconductor laser array 10 should be performed using the amount of current and the pulse width as the targets in the next optimization setting process.

Subsequently, the new pulse drive condition is set as the present pulse drive condition (step S170).

Subsequently, the control section 22 returns the process to the step S100. The control section 22 drives the semiconductor laser array 10 again with the present pulse drive condition which has been set to have new values of the amount of current and the pulse width to be applied to the semiconductor laser array 10. The control section 22 measures the intensity VL of the visible laser beam using the visible light sensor 204, and further measures the intensity IR of the infrared laser beam using the infrared beam sensor 20.

In the step S110 described above, as a result of the judgment, if it is judged that the intensities VL, IR have reached the predetermined ranges (Yes in step S110), since there is no particular necessity for changing the drive condition, the control section 22 returns the process to the step S110.

In the step S140 described above, as a result of the judgment, if it is judged that the intensities VLtest, IRtest have not been improved (No in step S140), the control section 22 executes the examination of the output of the infrared laser beam emitted from the semiconductor laser array 10 setting a new pulse drive condition different form the previous examination condition to the amount of current and the pulse width to be applied to the semiconductor laser array 10. In the examination, the control section 22 measures the intensity VLtest of the visible laser beam using the visible light sensor 204, and further measures the intensity IRtest of the infrared laser beam using the infrared beam sensor 20 (step S180). The new pulse drive condition is a value previously stored in the RAM based on the emission characteristic of the infrared laser beam of the semiconductor laser array 10 and the wavelength conversion efficiency characteristic of the wavelength conversion element 14.

Subsequently, the control section 22 controls the output of the infrared laser beam emitted from the semiconductor laser array 10 with the amount and the pulse width of the electric current to be applied to the semiconductor laser array 10 in the present pulse drive condition (step S190).

Subsequently, based on the measured values of the intensities VLtest, IRtest measured in the step S180, whether or not the intensities have been improved in comparison with the previous measured values is judged (step S200). These previous measured values are the intensities VL, IR in the present pulse drive condition at the first time, and on or later the second time, they become the intensities VLtest, IRtest in the previous new pulse drive condition.

As a result of the above judgment, if it is judged that the intensities VLtest, IRtest have not been improved (No in step S200), the control section 22 judges whether or not the intensities VLtest, IRtest are in the predetermined ranges (step S210).

As a result of the above judgment, if it is judged that the intensities VLtest, IRtest have reached the predetermined ranges (Yes in step S210), the control section 22 forwards the process to the step S160 and stores the amount of current and the pulse width applied to the semiconductor laser array 10 at that moment in the RAM (step S160). According to this step, the optimization of the semiconductor laser array 10 should be adjusted using the amount of current and the pulse width as the targets in the next optimization setting process.

In the step S150 described above, as a result of the judgment, if it is judged that the intensities VLtest, IRtest have not reached the predetermined ranges (No in step S150), the control section 22 returns the process to the step S120. Again, the control section 22 performs test control of the output of the infrared laser beam emitted from the semiconductor laser array 10 in a new pulse drive condition with the amount and the pulse width of the electric current to be applied to the semiconductor laser array 10 modified so that the direction of the change is the same. The control section 22 measures the intensity VLtest of the visible laser beam using the visible light sensor 204, and further measures the intensity IRtest of the infrared laser beam using the infrared beam sensor 20. Thus, the control of setting the new pulse drive condition to the amount of current and the pulse width to be applied to the semiconductor laser array 10 and testing the output of the infrared laser beam emitted from the semiconductor laser array 10 is performed until the output of the infrared laser beam emitted from the semiconductor laser array 10 reaches a predetermined range.

In the step S200 described above, as a result of the judgment, if it is judged that the intensities VLtest, IRtest have been improved (Yes in step S200), the control section 22 returns the process to the step S180. Again, the control section 22 performs the test control of the output of the infrared laser beam in a new pulse drive condition having the amount of current and the pulse width to be applied to the semiconductor laser array 10 modified in the direction of change opposite to the direction of change in the step S120, for example, in the laser drive condition of reducing the input energy if the input energy is increased in the step S120. The control section 22 measures the intensity VLtest of the visible laser beam using the visible light sensor 204, and further measures the intensity IRtest of the infrared laser beam using the infrared beam sensor 20 (step S180). The new pulse drive condition is a value previously stored in the RAM based on the emission characteristic of the infrared laser beam of the semiconductor laser array 10 and the wavelength conversion efficiency characteristic of the wavelength conversion element 14.

In the step S210 described above, as a result of judgment, if it is judged that the intensities VLtest, IRtest have not reached the predetermined ranges (No in step S210), the control section 22 judges that the present condition of the semiconductor laser array 10 is an unexpected condition in which the intensities are not improved even by either increasing or decreasing the amount of current and the pulse width applied to the semiconductor laser array 10. The process is returned again to the step S100. Thus, since the optimization setting process can be executed again from the beginning, an attempt to improve the light intensities can be made once more.

Pulse Drive Condition

FIG. 4 is a diagram of a pulse drive condition of a laser source according to the first embodiment of the invention. As shown in FIG. 4, the change in the pulse drive condition of the laser source according to the present embodiment is the change (change from a to a1) in the pulse width in the pulse drive condition ((B) in FIG. 4) from the original pulse drive condition ((A) in FIG. 4) to be applied to the semiconductor laser array 10. Alternatively, it is the change (change from b to b1) in the amount of current in the pulse drive condition ((C) in FIG. 4) from the original drive condition ((A) in FIG. 4) to be applied to the semiconductor laser array 10. Further, it includes the change (change from a to a2) in the pulse width and the change (change from b to b2) in the amount of current in the pulse drive condition ((D) in FIG. 4) from the original drive condition ((A) in FIG. 4) to be applied to the semiconductor laser array 10. They are set as the new pulse drive condition, and the output of the infrared laser beam emitted from the semiconductor laser array 10 is controlled.

Temperature Dependence

Figure 5A:
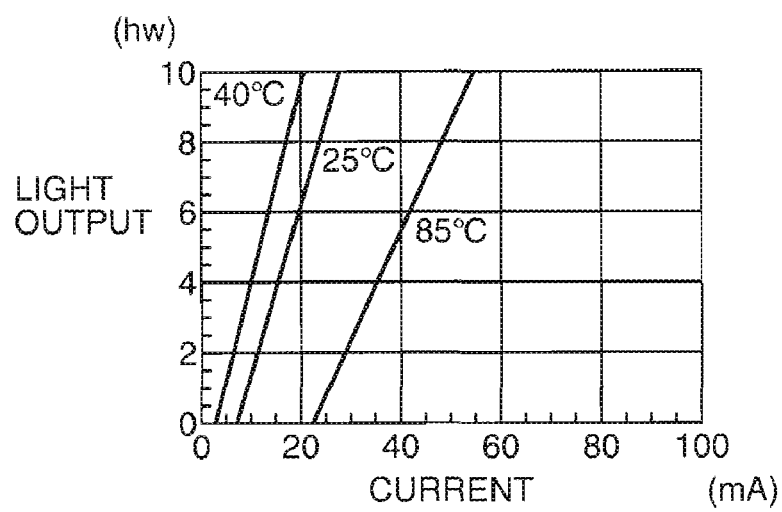
FIGS. 5A through 5C are diagrams showing temperature dependence according to the first embodiment of the invention.
Figure 5B:
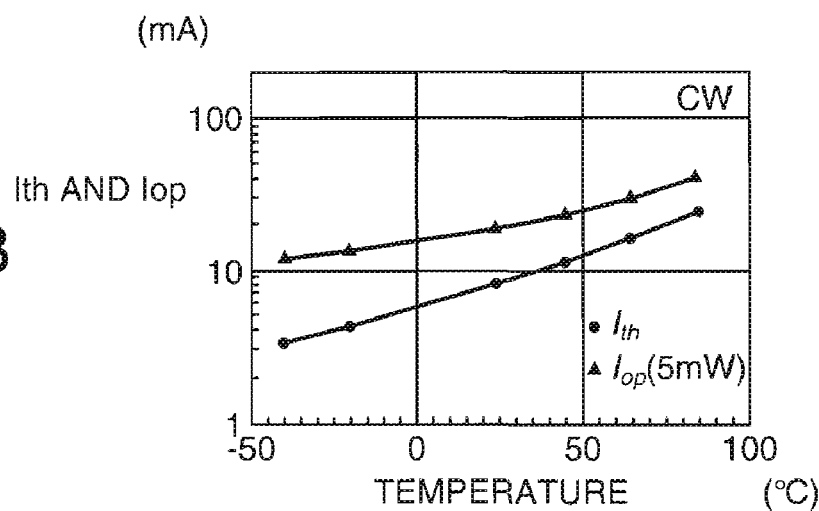
Figure 5C:
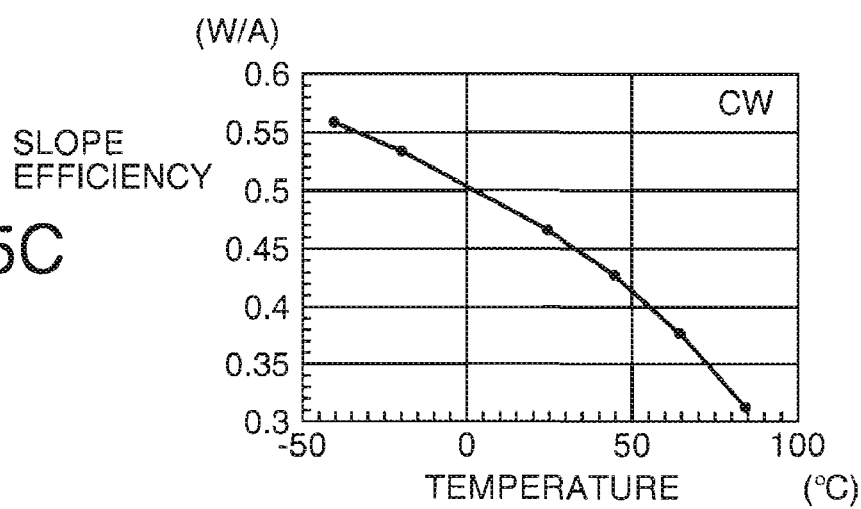

FIGS. 5A to 5C are diagrams showing temperature dependence according to the first embodiment of the invention. As shown in FIGS. 5A to 5C, the optical output of the semiconductor laser according to the present embodiment has temperature dependence. For example, FIG. 5A is a graph showing a relationship between the current and the optical output. The graph shows that the relationship between the current and the optical output has temperature dependence. Further, FIG. 5B is a graph showing the threshold current and the operating current versus temperature. It shows that the threshold current and the operating current each have temperature dependence. Further, FIG. 5C is a graph showing a relationship between the slope efficiency and the temperature. It shows that the slope efficiency has temperature dependence.

Figure 6:
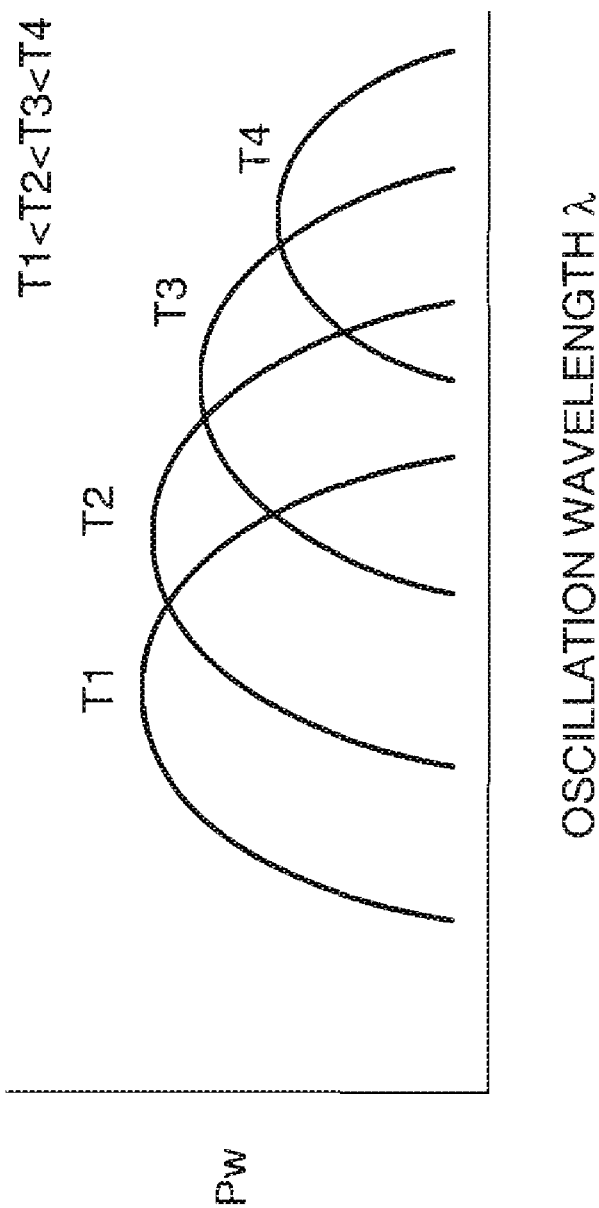
FIG. 6 is a diagram showing temperature dependence of an oscillation wavelength and a power output of a semiconductor laser according to the first embodiment of the invention.

FIG. 6 is a diagram showing temperature dependence of an oscillation wavelength and a power output of a semiconductor laser according to the first embodiment of the invention. For example, in accordance to the change of increasing the temperature (T1<T2<T3<T4), the oscillation wavelength λ shifts in a direction of increasing the wavelength, and the output power Pw shifts in a direction of decreasing the power.

According to the present embodiment, since the drive condition of the laser beam is restored to the present pulse drive condition in a predetermined period of time in extracting the optimum pulse drive condition, the optimum pulse drive condition can be obtained while being hardly sensed by the observer. By achieving the optimization of the pulse drive condition of the light source, the optimization of the temperature of the wavelength conversion element can be achieved to obtain a high-efficiency and high-power light beam, thus a bright picture can be obtained.

Second Embodiment

Optimization Setting Section

Figure 7:
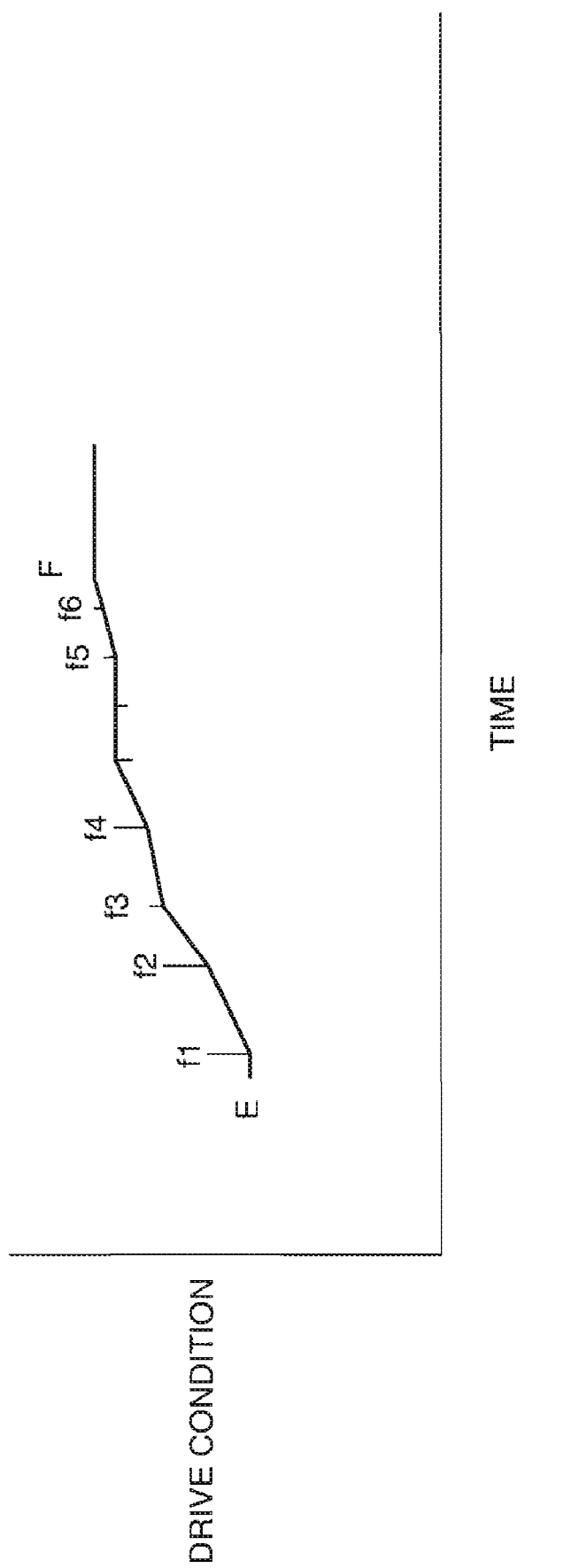
FIG. 7 is a diagram showing an optimization setting section according to a second embodiment of the invention.

FIG. 7 is a diagram showing an optimization setting section according to a second embodiment of the invention. The optimization setting section 22B (see FIG. 1) according to the present embodiment performs transition from the present pulse condition to the optimum pulse drive condition and extraction of the extracting pulse drive condition in a continuous manner. As shown in FIG. 7, when an extracting pulse drive condition f1 for outputting the light beam with a better intensity than in the present pulse drive condition E has been obtained, the transition to the extracting pulse drive condition f1 outputting the light beam with the better intensity is performed. In the transition to the extracting pulse drive condition f1 outputting the light beam with the better intensity, a predetermined period of time is spent, a different pulse drive condition setting is performed prior to the transition to the extracting pulse drive condition f1 outputting the light beam with the better intensity, then the switching of the pulse drive condition is performed so as not to be sensed by the observer, and the present pulse drive condition is set. Thereafter, the switching to the extracting pulse drive conditions f2 through f6 is sequentially performed, and the switching to the optimum pulse drive condition F for outputting the light beam with a predetermined intensity is performed. It should be noted that transition to the bad extracting pulse drive condition is not performed.

Optimization Setting Process

Figure 8:
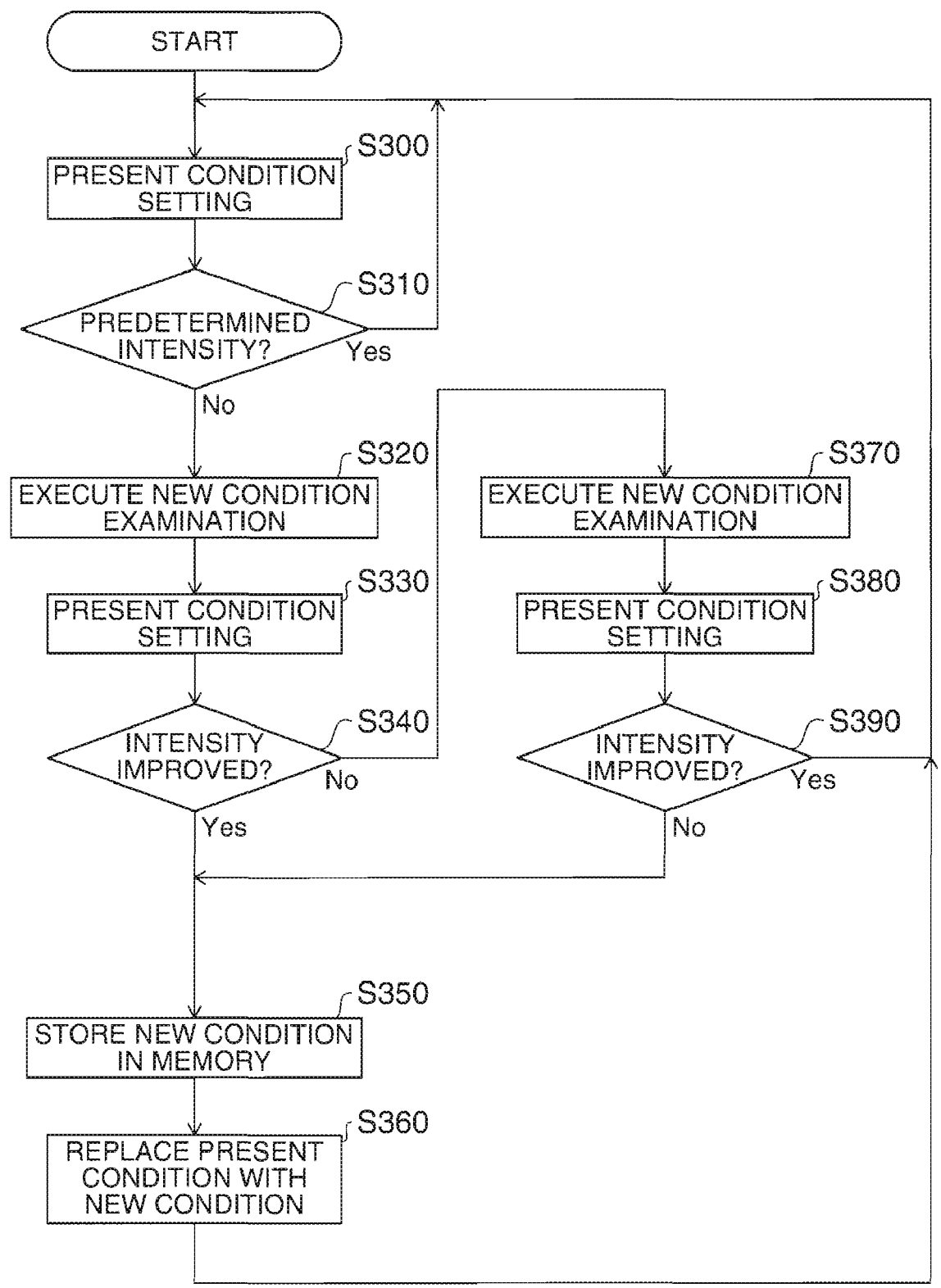
FIG. 8 is a flowchart of an optimization setting process according to the second embodiment of the invention.

FIG. 8 is a flowchart of an optimization setting process according to the second embodiment of the invention. When the process is started, as shown in FIG. 8, firstly, the control section 22 sets the present pulse drive condition to the amount of the current and pulse width to be applied to the semiconductor laser array 10. The control section 22 measures the intensity VL of the visible laser beam using the visible light sensor 204, and further measures the intensity IR of the infrared laser beam using the infrared beam sensor 20 (step S300).

Subsequently, based on these measured values, whether or not the intensities VL, IR are in predetermined ranges is judged (step S310). These predetermined intensities are values previously stored in the RAM based on the emission characteristic of the infrared laser beam of the semiconductor laser array 10 and the wavelength conversion efficiency characteristic of the wavelength conversion element 14.

As a result of the above judgment, if it is judged that the intensities VL, IR do not reach the predetermined ranges (No in step S310), the control section 22 sets a new pulse drive condition to the amount of current and the pulse width to be applied to the semiconductor laser array 10, and executes an examination of the output of the infrared laser beam emitted from the semiconductor laser array 10. In the examination, the control section 22 measures the intensity VLtest of the visible laser beam using the visible light sensor 204, and further measures the intensity IRtest of the infrared laser beam using the infrared beam sensor 20 (step S320). The new pulse drive condition is a value previously stored in the RAM based on the emission characteristic of the infrared laser beam of the semiconductor laser array 10 and the wavelength conversion efficiency characteristic of the wavelength conversion element 14.

Subsequently, the control section 22 performs setting for restoring the amount of current and the pulse width to be applied to the semiconductor laser array 10 to the present pulse drive condition (step S330).

Subsequently, based on the measured values of the intensities VLtest, IRtest measured in the step S320, whether or not the intensities have been improved in comparison with the previous measured values is judged (step S340). These previous measured values are the intensities VL, IR in the present pulse drive condition at the first time, and on or later the second time, they become the intensities VLtest, IRtest in the previous new pulse drive condition.

As a result of the above judgment, if it is judged that the intensities VLtest, IRtest have been improved (Yes in step S340), the amount of current and the pulse width applied to the semiconductor laser array 10 at that moment are stored in the RAM (step S350). According to this step, the optimization of the drive condition of the semiconductor laser array 10 should be performed using the amount of current and the pulse width as the targets in the next optimization setting process.

Subsequently, the new pulse drive condition is set as the present condition (step S360).

Subsequently, the control section 22 returns the process to the step S300. The control section 22 drives the semiconductor laser array 0 again with the present pulse drive condition which has been set to have new values of the amount of current and the pulse width to be applied to the semiconductor laser array 10. The control section 22 measures the intensity VL of the visible laser beam using the visible light sensor 204, and further measures the intensity IR of the infrared laser beam using the infrared beam sensor 20.

In the step S310 described above, as a result of the judgment, if it is judged that the intensities VL, IR have reached the predetermined ranges (Yes in step S310), since there is no particular necessity for changing the drive condition, the control section 22 returns the process to the step S300.

In the step S340 described above, as a result of the judgment, if it is judged that the intensities VLtest, IRtest have not been improved (No in step S340), the control section 22 compares the amount of current and the pulse width to be applied to the semiconductor laser array 10 with parameters in the step S320. The examination of the output of the infrared laser beam emitted from the semiconductor laser array 10 is performed in a new pulse drive condition changed from the present condition towards the side different from the side towards which the condition in the step S320 is changed, specifically, in the condition of decreasing the input energy if the input energy is increased in the step S320 contrary thereto. In the examination, the control section 22 measures the intensity VLtest of the visible laser beam using the visible light sensor 204, and further measures the intensity IRtest of the infrared laser beam using the infrared beam sensor 20 (step S370). The new pulse drive condition is a value previously stored in the RAM based on the emission characteristic of the infrared laser beam of the semiconductor laser array 10 and the wavelength conversion efficiency characteristic of the wavelength conversion element 14.

Subsequently, the control section 22 controls the output of the infrared laser beam emitted from the semiconductor laser array 10 with the amount and the pulse width of the electric current to be applied to the semiconductor laser array 10 in the present pulse drive condition (step S380).

Subsequently, based on the measured values of the intensities VLtest, IRtest measured in the step S370, whether or not the intensities have been improved in comparison with the previous measured values is judged (step S390). These previous measured values are the intensities VL, IR in the present pulse drive condition at the first time, and on or later the second time, they become the intensities VLtest, IRtest in the previous new pulse drive condition.

As a result of the above judgment, if it is judged that the intensities VLtest, IRtest have not been improved (No in step S390), the control section 22 forwards the process to the step S350 and stores the amount of current and the pulse width applied to the semiconductor laser array 10 at that moment in the RAM. According to this step, the optimization of the semiconductor laser array 10 should be adjusted using the amount of current and the pulse width as the targets in the next optimization setting process.

In the step S390 described above, as a result of the judgment, if it is judged that the intensities VLtest, IRtest have been improved (Yes in step S390), since there is no particular necessity for changing the drive condition, the control section 22 returns the process to the step S300. As other parts of the configuration and the control method, the content explained in the first embodiment can be applied.

Third Embodiment

Configuration of Monitor Device

Figure 9:
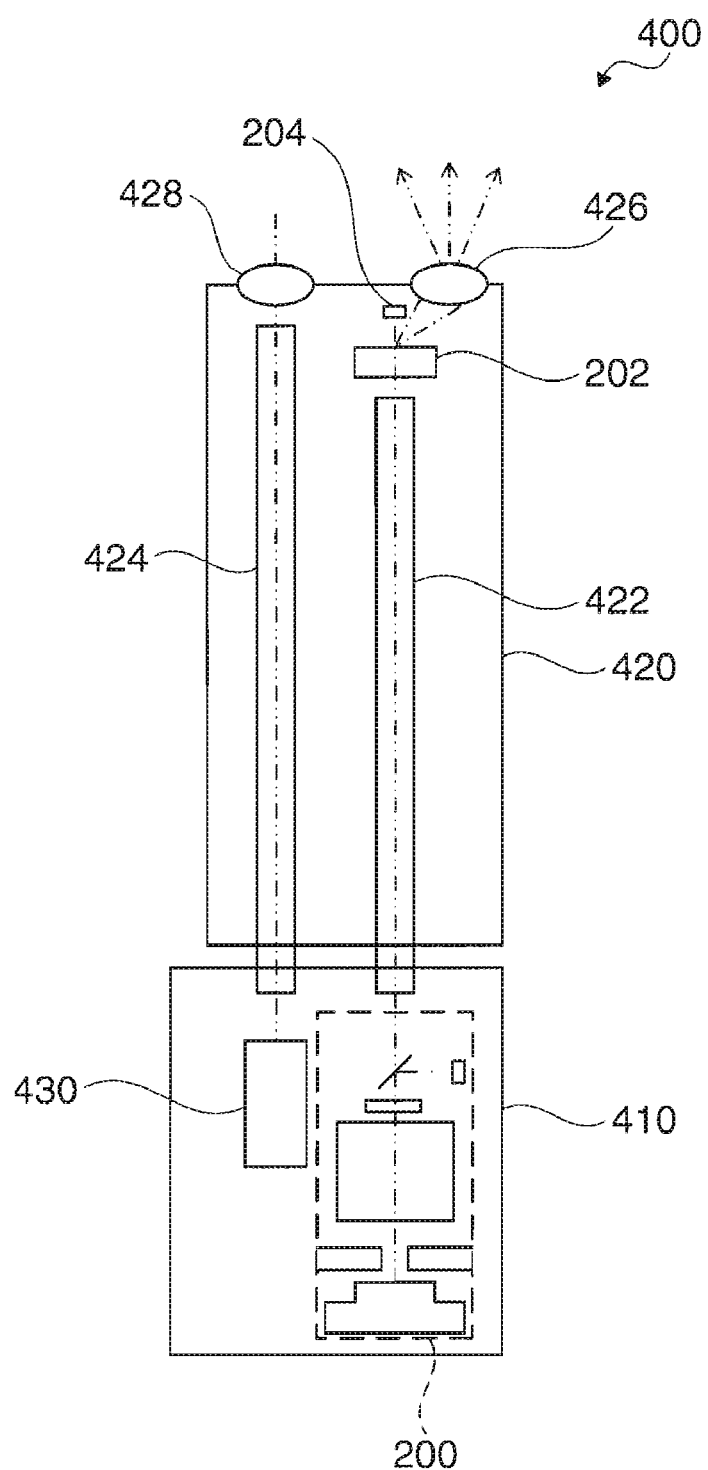
FIG. 9 is a diagram showing a configuration of a monitor device according to a third embodiment of the invention.

FIG. 9 is a diagram showing a configuration of a monitor device according to a third embodiment of the invention. As shown in FIG. 9, the monitor device 400 according to the present embodiment includes a device main body 410 and a light transmission section 420. The device main body 410 includes the light source device 200 of the first embodiment described above. Although detailed illustration is omitted, as explained in the first embodiment, the light source device 200 includes the semiconductor laser array 10, the light shield plate 12, the wavelength conversion element 14, the reflecting mirror 16, the infrared beam splitter 18, the infrared beam sensor 20, and the control section 22.

The light transmission section 420 includes two light guides 422, 424 of a light transmission side and a light reception side, respectively. Each of the light guides 422, 424 is a bundle of a number of optical fibers, and is capable of transmitting a visible laser beam over a long distance. The light source device 200 is disposed on an entrance side of the light guide 422 of the light transmission side, and the hologram element 202, the visible light sensor 204, and a diffusing plate 426 are disposed on an emission side thereof. The visible laser beam emitted from the light source device 200 is transmitted through the light guide 422 to reach the hologram element 202 provided to the tip of the light transmission section 420, and the diffusing plate 426 is lighted by the hologram 202, and finally, the subject is lighted by the diffusing plate 426. The zero-order light emitted from the hologram element 202 enters the visible light sensor 204.

On the tip of the light transmission section 420, there is also provided an imaging lens 428, and the reflected light from the subject can be received by the imaging lens 428. The received reflected light is transmitted through the light guide 424 on the light reception side to a camera 430 as an image pickup section disposed inside the device main body 410. As a result, an image based on the reflected light obtained by irradiating the subject with the visible laser beam emitted from the light source device 200 can be imaged by the camera 430.

According to the monitor device 400 configured as described above, since the subject can be irradiated by the high-power light source device 200, a bright image can be shot by the camera 430. The camera 430 can be connected to various display devices such as a CRT, a liquid crystal display, and a projector.

It should be noted that the various modified examples explained in the first embodiment can obviously be applied also to the monitor device 400 of the third embodiment described above.

Fourth Embodiment

Configuration of Image Display Device

Figure 10:
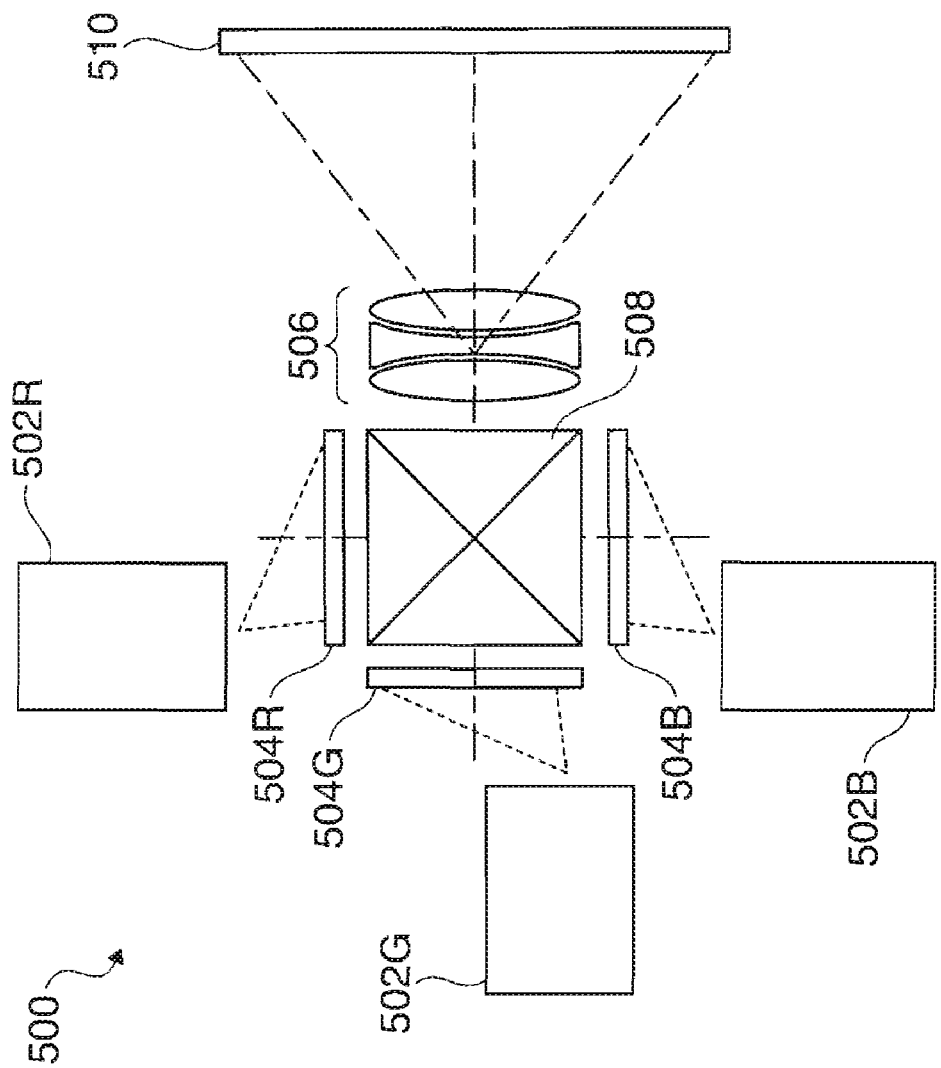
FIG. 10 is a diagram showing a configuration of an image display device according to a fourth embodiment of the invention.
Figure 11:
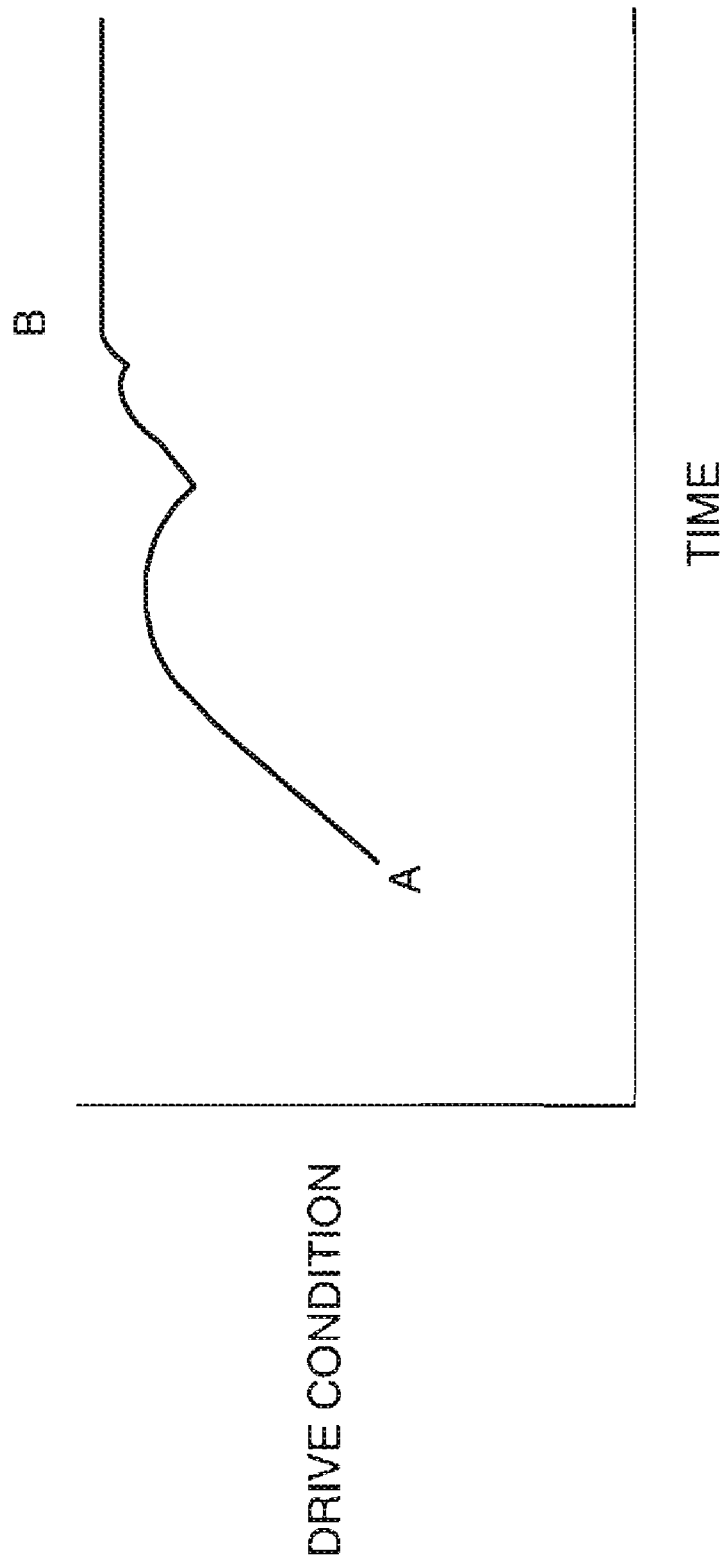
FIG. 11 is a diagram showing a relationship between elapsed time and a light source output in a past pulse drive condition setting.

FIG. 10 is a diagram showing a configuration of an image display device according to a fourth embodiment of the invention. As shown in FIG. 10, a projector 500 according to the present embodiment includes a red lighting device 502R for emitting a red light beam, a green lighting device 502G for emitting a green light beam, and a blue lighting device 502B for emitting a blue light beam.

The red lighting device 502R, the green lighting device 502G, and the blue lighting device 502B each have the same configuration as the lighting device 100 of the first embodiment described above. The lighting device 100 includes the semiconductor laser array 10, the light shield plate 12, the wavelength conversion element 14, the reflecting mirror 16, the infrared beam splitter 18, the hologram element 202, the infrared beam sensor 20, the visible light sensor 204, and the control section 22. In the wavelength conversion element 14 provided to the red lighting device 502R, the wavelength conversion from the infrared laser beam to the red beam is performed, and in the wavelength conversion element 14 provided to the green lighting device 502G, the wavelength conversion from the infrared laser beam to the green beam is performed. Further, in the wavelength conversion element 14 provided to the blue lighting device 502B, the wavelength conversion from the infrared laser beam to the blue beam is performed.

The projector 500 includes liquid crystal light valves 504R, 504G, and 504B for respectively modulating the lighting beams emitted form the lighting devices 502R, 502G, and 502B for respective colors in accordance with image signals transmitted from a personal computer or the like. Further, the projector 500 includes a cross dichroic prism 508 for combining the light beams emitted from the liquid crystal light valves 504R, 504G, and 504B and leading the combined light beams to a projection lens 506. Further, the projector 500 includes the projection lens 506 for enlargedly projecting the image formed by the liquid crystal light valves 504R, 504G, and 504B on a screen 510.

The three colored light beams modulated by the respective liquid crystal light valves 504R, 504G, and 504B then enter the cross dichroic prism 508. The prism is formed by bonding four rectangular prisms, and is provided with a dielectric multilayer film for reflecting red light and a dielectric multilayer film for reflecting blue light disposed on the inside surfaces forming a crisscross. The three colored light beams are combined by these dielectric multilayer films to form a light beam for displaying a color image. Further, the light beam obtained by combining the three colored light beams is projected on the screen 510 by the projection lens 506, thus an enlarged image is displayed.

According to the projector 500 configured as described above, it becomes possible to display a high-intensity image using the laser as the light source.

It should be noted that the various modified examples explained in the first embodiment can obviously be applied also to the projector 500 of the fourth embodiment described above. Further, although the projector 500 of the present embodiment is a so-called three-LCD projector, a single-LCD projector having a configuration capable of achieving the color display with a single light valve by lighting the laser source in a time-sharing manner for every color can also be adopted instead thereof Further, although in the projector described above the liquid crystal valves are adopted as light modulation sections, digital micromirror devices (DMD, the registered trademark) and so on can also be adopted as the light modulation sections.

Hereinabove, the various embodiments of the invention and the modifications thereof are described. It is obvious that the invention is not limited to these embodiments or the modifications, but can take various configurations within the scope of the invention.

What is claimed is:

1. A light source device comprising:
   a light source that emits a laser beam;
   a power supply drive circuit that pulse-drives the laser beam;
   a wavelength conversion element that converts a wavelength of a laser beam into a predetermined wavelength;
   a photodetector that detects an intensity of the laser beam emitted from the wavelength conversion element; and
   a control section that controls a drive condition of the laser beam emitted from the wavelength conversion element based on the intensity detected by the photodetector;
   an optimization setting section located within the control section that, in response to the intensity detected by the photodetector in a present pulse drive condition being outside a predetermined range,
   extracts an optimum pulse drive condition,
   changes the present pulse drive condition to an intermediate pulse drive condition, the intermediate pulse drive condition being different from both of the present pulse drive condition and the optimum pulse drive condition,
   sets the extracted optimum pulse drive condition to the drive condition of the laser beam, and
   after a predetermined period of time, restores the present pulse drive condition.

2. The light source device according to claim 1, wherein the optimization setting section changes the drive condition of the laser beam in a discontinuous manner.

3. The light source device according to claim 1, wherein the optimization setting section changes the drive condition of the laser beam from the present pulse drive condition to the optimum pulse drive condition via at least one pulse drive condition different from both the present pulse drive condition and the optimum pulse drive condition.

4. The light source device according to claim 1, wherein the optimization setting section, in changing the drive condition of the laser beam to the optimum pulse drive condition, changes the drive condition of the laser beam so that a change in the intensity from the present pulse drive condition to the optimum pulse drive condition has a predetermined gradient.

5. A control method of a light source device, comprising:
   (a) emitting a laser beam;
   (b) pulse-driving the laser beam;
   (c) converting a wavelength of a laser beam into a predetermined wavelength;
   (d) detecting an intensity of the laser beam emitted in step (c); and
   (e) controlling a drive condition of the laser beam emitted in step (c) based on the intensity detected in step (d),
   wherein step (e) includes
   (f) extracting, in response to the intensity detected in step (d) in a present pulse drive condition being outside a predetermined range, an optimum pulse drive condition, changing the present pulse drive condition to an intermediate pulse drive condition, the intermediate pulse drive condition being different from both of the present pulse drive condition and the optimum pulse drive condition, and setting the extracted optimum pulse drive condition to the drive condition of the laser beam instead of the present pulse drive condition, and
   step (f) includes
   (g) restoring, after a predetermined period of time, the present pulse drive condition.

6. The control method of a light source device according to claim 5, wherein in step (f), the drive condition of the laser beam is changed in a discontinuous manner.

7. The control method of a light source device according to claim 5, wherein in step (f), the drive condition of the laser beam is changed from the present pulse drive condition to the optimum pulse drive condition via at least one pulse drive condition different from both the present pulse drive condition and the optimum pulse drive condition.

8. The control method of a light source device according to claim 5, wherein in step (f), in changing the drive condition of the laser beam to the optimum pulse drive condition, the drive condition of the laser beam is changed so that a change in the intensity from the present pulse drive condition to the optimum pulse drive condition has a predetermined gradient.

9. The light source according to claim 1, wherein the control section controls the drive condition of the laser beam by controlling at least one of:
   (i) a pulse width of electric current used for pulse-driving the laser beam; and
   (ii) an amount of electric current applied for driving the laser beam.

10. The control method of a light source device according to claim 5, wherein the drive condition of the laser beam is controlled by controlling at least one of:
    (i) a pulse width of electric current used for pulse-driving the laser beam; and
    (ii) an amount of electric current applied for driving the laser beam.

11. The light source according to claim 1, further comprising:
    a temperature control element that controls the temperature of the wavelength conversion element.

12. The control method of a light source device according to claim 5, further comprising:
    controlling an operating temperature of a wavelength conversion element.

13. The light source according to claim 1, wherein the optimum pulse drive condition corresponds, at least in part, to an optimal operating temperature of the light source.

14. The control method of a light source device according to claim 5, wherein the optimum pulse drive condition corresponds, at least in part, to an optimal operating temperature of the light source.

15. The light source according to claim 1, wherein the control section controls the drive condition of the laser beam emitted from the wavelength conversion element based on at least one of:
   (i) the intensity of visible light detected by the photodetector; and
   (ii) the intensity of infrared light detected by the photodetector.

16. A lighting device comprising the light source device according to claim 1.

17. A monitor device comprising:
   the lighting device according to claim 9; and
   an imaging section that images a subject lighted by the lighting device.

18. An image display device comprising:
   the lighting device according to claim 9, wherein the image display device displays an image using light from the lighting device.

19. A light source device comprising:
   a light source that emits light, the light having at least one wavelength;
   a power supply that supplies power to the light source;
   a wavelength conversion unit that converts the at least one wavelength of the light emitted from the light source to a predetermined wavelength, the wavelength conversion unit comprising at least one light incident side and at least one light emitting side,
   wherein at least a portion of the light emitted from the light source enters the wavelength conversion unit through the at least one light incident side and converted light having the predetermined wavelength exits the wavelength conversion unit through the at least one light emitting side;
   a control unit that controls at least one variable affecting the light being emitted from the light source, such that the control unit optimizes an operating condition of the light source to ensure that the wavelength conversion unit operates at a substantially optimal condition; and
   in optimizing the operating condition of the light source, the control unit (1) extracts an optimum pulse drive condition, (2) changes a present pulse drive condition to an intermediate pulse drive condition, the intermediate pulse drive condition being different from both of the present pulse drive condition and the optimum pulse drive condition, (3) sets the extracted optimum pulse drive condition to the drive condition of the laser beam, and (4) restores the present pulse drive condition after a predetermined period of time.

* * * * *